United States Patent [19]

Hill et al.

[11] Patent Number: 4,499,354
[45] Date of Patent: Feb. 12, 1985

[54] SUSCEPTOR FOR RADIANT ABSORPTION HEATER SYSTEM

[75] Inventors: Lawrence B. Hill, Short Hills, N.J.; Dennis Garbis, Dix Hills, N.Y.; Robert C. Heller, Stonybrook, N.Y.; Amedeo J. Granata, Flushing, N.Y.

[73] Assignee: General Instrument Corp., Clifton, N.J.

[21] Appl. No.: 433,158

[22] Filed: Oct. 6, 1982

[51] Int. Cl.³ .............................................. H05B 6/10
[52] U.S. Cl. .......................... 219/10.49 R; 219/10.67; 219/354; 118/725; 118/728; 118/50.1
[58] Field of Search ...................... 219/10.49 R, 10.67, 219/10.57, 10.43, 354; 118/725, 728–732, 500, 50.1, 620; 427/45.1, 55

[56] References Cited

U.S. PATENT DOCUMENTS

| | | | |
|---|---|---|---|
| 3,180,917 | 4/1965 | Morrison et al. | 219/10.49 R X |
| 3,293,074 | 12/1966 | Nickl | 118/725 X |
| 3,301,213 | 1/1967 | Grochowski et al. | 118/725 |
| 3,665,139 | 5/1972 | Steggewentz | 219/10.43 |
| 4,093,201 | 6/1978 | Dietze et al. | 118/728 X |
| 4,168,998 | 9/1979 | Hasegawa et al. | 219/10.49 R X |

Primary Examiner—P. H. Leung
Attorney, Agent, or Firm—James & Franklin

[57] ABSTRACT

A susceptor for use in a chemical vapor deposition process in a radiant absorption heating system comprises a heater adapted to absorb radiant energy and a sheath of high purity quartz completely surrounding the heater. The sheath further comprises dimples inside the sheath spacing the sheath from the heater. The heater may be graphite having a substantially pinhole-free outgas-inhibiting outer-coating such as silicon carbide.

17 Claims, 2 Drawing Figures

SUSCEPTOR FOR RADIANT ABSORPTION HEATER SYSTEM

BACKGROUND OF THE INVENTION

The present invention relates to susceptors, and more particularly to susceptors useful in a chemical vapor deposition process occuring in a radiant absorption heater system.

Chemical vapor deposition processes are currently used to produce a variety of high purity materials and are of special utility in the production of III–V materials (such as gallium arsenide) and other epitaxial compositions used for semiconductors, etc.

The chemical vapor deposition process is typically performed in any of a variety of reactors well recognized in the art, including horizontal reactors, vertical reactors, pancake reactors and the like. Broadly, the reactors fall into two different classifications: radiant absorption heater systems (such as cold wall reactors) and oven reactors (such as hot wall reactors). Cold wall or radiant energy absorption systems are typically preferred over hot wall reactors for many reasons including their better yields and throughputs.

In the oven reactor, all of the equipment associated with the process is heated more-or-less to the reaction temperature of the source gases, which then deposit the material to be formed not only on the intended substrate, but also, for example, on the walls of the reactor vessel, thereby wasting both energy and the source materials, creating cleaning problems and, when different source materials are to be used for successive runs, presenting contamination problems between runs. By way of contrast, in a radiant absorption heating system, radiant energy in the form of radio frequency (RF), infra-red (IR) or microwave energy is projected from outside the reactor vessel into the reactor vessel where it is selectively absorbed by a susceptor. As the energy is absorbed by the susceptor, the susceptor becomes hotter than the surrounding elements of the reactor vessel and consequently selectively heats up a susceptor-carried substrate for the material to be deposited. While the selective heating of the substrate relative to the other reactor vessel elements is a clear advantage of the radiant absorption heater system, economic operation of such a system clearly requires a susceptor which will efficiently absorb the energy being introduced. The present invention is directed to a susceptor for use in such a radiant absorption heater system.

Various considerations severely restrict the selection of material for use as a susceptor. Clearly the material must be capable of efficiently absorbing the specific form of radiant energy being introduced into the reaction vessel so as to minimize the energy input required to bring the system to, and maintain it at, its usual operating temperature (this typically being in the neighborhood of 700° C. or higher for the production of epitaxial III-V materials). Obviously the material must also be chemically inert with respect to the materials it contacts, including the source gases being introduced into the reaction vessel, and must not be a source of contamination to either the source gases, the substrate or the material being produced. When heated to the temperatures typically encountered by susceptors (often in excess of 1,000° C.), most materials outgas— that is, they release from within gases which act as a source of contamination for the source gases, the substrates, and the material to be deposited, thereby introducing elements foreign to the desired reaction and resulting in an inferior end-product. Finally, use of the material must be economically feasible in the quantities required for susceptor use.

To illustrate the difficulties encountered in selecting an appropriate material for a susceptor, one has only to consider the difficulty encountered with materials typically suggested for such purposes. High purity quartz is not only relatively inert, but exhibits very little outgassing. On the other hand, high purity quartz is not a good absorber of radiant energy and therefore is not useful as a susceptor, although it has been used as a substrate holder in hot oven reactors. One can, of course, increase the level of absorption of radiant energy by high purity quartz simply by coating the quartz with black (for example, carbon black), but this introduces a major source of contamination defeating the purpose of using the high purity quartz in the first place.

Graphite (one form of carbon) and glassy carbon (another form of carbon) are both good absorbers of radiant energy, but both exhibit substantial outgassing at elevated temperatures. Furthermore, diodes fabricated with susceptors made of such materials have been found to possess "leaky" electrical characteristics. While these materials may be coated with silicon carbide to effect a seal of the graphite or glassy carbon and prevent outgassing therefrom, the silicon carbide is not itself inert to the source gases typically utilized in III—V epitaxy.

Silicon carbide by itself is difficult to formulate in the desired thickness for a susceptor, is too expensive for general use, and is reactive with certain source gases. Molybdenum is also unsatisfactory for various reasons.

Accordingly, it is an object of the present invention to provide a susceptor for use in a chemical vapor deposition process in a radiant absorption heater system which efficiently absorbs the radiant energy being employed, is economically feasible, is chemically inert with respect to the possible products and reactants, and is a minimal source of contaminants.

A further object is to provide such a susceptor which combines the high heat absorption of graphite, the low outgassing characteristic of silicon carbide, and the chemical inertness of high purity quartz to process gases and materials.

SUMMARY OF THE INVENTION

It has now been found that the above and related objects of the present invention are obtained in a susceptor for use in a chemical vapor deposition process in a radiant absorption heater system comprising a heater adapted to absorb radiant energy and a sheath of high purity quartz completely surrounding the heater.

Preferable the susceptor further comprises means inside the sheath for spacing the sheath from the heater. The spacing means is desirable a part of the sheath and makes minimal contact with the heater; for example, the spacing means may comprise protrusions from the interior surfaces of the sheath which terminate in tips of minimal area.

Optionally the susceptor further comprises means in the sheath for providing access to the interior of the sheath, and means for closing the access means. The sheath and the means for closing the access means together define a substantially gas-impermeable enclosure totally containing the heater. The space between the heater and the sheath may be evacuated or a gas of relatively high thermal conductivity and relative inertness to the compositions of the sheath and heater may be present. Typically, the gas is helium, and the amount of gas is desirably such as to exert a pressure of about one atmosphere at the operating temperature of the susceptor.

In a preferred embodiment the heater has an interior of a first composition and a substantially pinhole-free outgas-inhibiting outer coating.

DETAILED DESCRIPTION OF THE PREFERRED EMBODIMENTS

Figure 1:
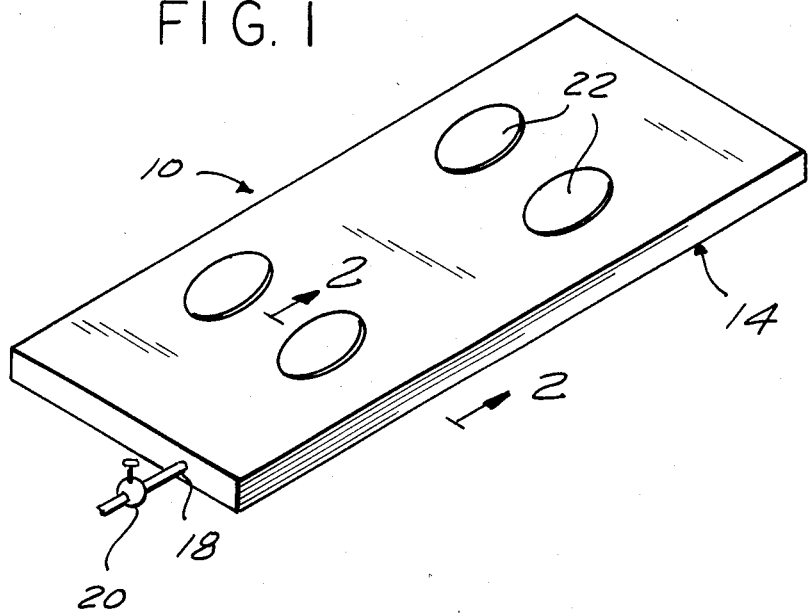
FIG. 1 is an isometric view of a susceptor according to the present invention.
Figure 2:
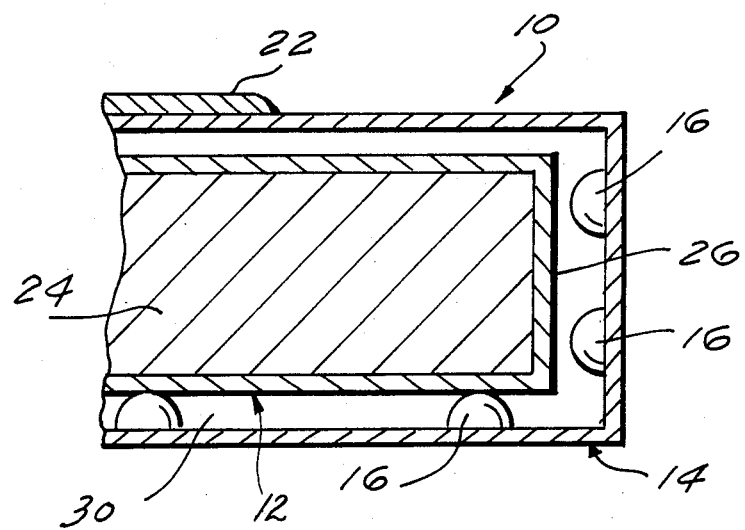
FIG. 2 is a fragmentary sectional view of the susceptor taken along the line 2—2 of FIG. 1.

Referring now to FIGS. 1 and 2, a susceptor according to the principles of the present invention, generally designated by the numeral 10 and adapted for use in a chemical vapor deposition process in a radiant absorption heating system, comprises essentially a heater, generally designated by the numeral 12 and adapted to absorb radiant energy, and a sheath of high purity quartz, generally designated by the numeral 14 and completely surrounding the heater 12. The susceptor further comprises means 16 inside the sheath 14 for spacing the sheath 14 from the heater 12, means 18 in the sheath 14 for providing access to the interior of the sheath, and means 20 for closing the access means 18.

The susceptor 10 is suitable for use in any of the radiant absorption heating systems wherein energy is introduced into the susceptor-containing enclosure from without, the only limitation being that the radiant energy being directed into the enclosure must be of the type which is efficiently absorbed by the interior of the heater 12. The enclosure may be a horizontal reactor, a vertical reactor, a belljar/pancake assembly or the like. The dimensions of a susceptor will, of course, vary with the intended application, but a box-like susceptor for a horizontal reactor may be about 24 inches long, 10 inches wide, and 1 inch thick. Before the process gases are introduced into the enclosure of the heating system, a plurality of substrates 22 are disposed on an upwardly facing surface of the susceptor to define preferential deposit points for the process gases (including their reaction products). The substrates 22 are generally of wafer-like configuration, although other configurations may be adopted for particular applications, as will be appreciated by those skilled in the art. In use, the susceptor will be generally horizontal. Where the susceptor is inclined to the horizontal at a substantial angle during use, tabs or lugs of high purity quartz may be secured to the other surface of the susceptor to provide support for the substrate to be placed thereon.

The heater 12 generally has an interior 24 of a first composition and a substantially pinhole-free outgas-inhibiting outer coating 26 completely surrounding said interior. The composition of the interior 24 is preferable selected from the group consisting of graphite, glassy carbon, quartz coated with black, molybdenum and silicon carbide. Graphite and glassy carbon are both good absorbers of radiant energy, graphite being the preferred material for the interior. While quartz itself is not a good absorber of radiant energy, quartz coated with black (such as carbon black) may be used for the interior, as the coating increases its absorptive properties. Silicon carbide and molybdenum may also be used in certain instances. Silicon carbide, however, is difficult to formulate in the desired thickness for a susceptor heater and is too expensive for general use. Molybdenum cannot be used where the radiant energy is of radio frequency due to its tendency to couple (although it may be used where the radiant energy is of infrared frequency) and cannot be used in the presence of certain process gases with which it reacts.

The substantially pinhole-free outgas-inhibiting outer coating 26 may be formed of any material which forms a pinhole-free outgas-inhibiting coating, with silicon carbide being preferred. The silicon carbide outer coating not only prevents outgas gases from escaping the heater 12, but actually inhibits the development of outgas from the interior 24 so there is no build-up of pressure within the volume enclosed by the outer coating 26 as the susceptor is being heated to its operating temperature. This is an important factor as otherwise the outgassing from the interior 24 might rupture the outer coating 26, thus destroying the integrity of the heater 12. The outer coating 26 is preferably about 6–8 mils thick and conforms generally to the configuration of the interior 24, which interior 24 is illustrated as a box-like slab, but may be varied to meet the needs of particular applications.

The sheath 14 completely surrounds the heater 12 (and in particular the outer coating 26 thereof) and may be formed of any of the commercially available high purity quartz compositions such as those available under the trademarks Supersil, Vitrisil, and Amersil. The sheath 14 is a self-supporting structure and may be comprised simply of six quartz slabs suitably joined together to form a single box or a greater number of slabs suitably joined together (e.g., with heat-resistant glue) to form other configurations. If desired, the sheath may be in the form of a cylinder. The thickness of the sheath 14 is preferably about 100–120 mils. Generally it is desirable that at least the substrate-supporting surface of the sheath 14 be parallel to the corresponding surface of the heater 12, with the thickness of this face of the susceptor sheath being uniform.

While high purity quartz would not be suitable for use in the heater 12 because of its poor radiant heat absorption properties, it is sufficiently conductive for the communication of heat from the heater 12 at an elevated temperature to the substrates 22. The quartz protects the outgas-inhibiting silicon carbide coating 26 of the heater from the process gases with which it would otherwise react.

In order to space the interior surfaces of the sheath 14 from the exterior surface of the heater 12 (that is, its outer coating 26), the interior surfaces of the sheath 14 are provided with protrusions 16 extending towards the heater 12 and terminating in tips of minimal area so as to provide minimal contact with the heater 12. Generally, the protrusions 16 are provided on the bottom and side faces of the sheath 14, but may be omitted from the top face as gravity will preclude contact between the heater 12 and the undersurface of the top face of sheath 14. As only the minimal area tips of the protrusions 16 actually make contact with the heater 12, devitrification of the quartz of the sheath 14 is minimized. Preferable protrusions extend inwardly sufficiently to insure a temperature differential between the heater 12 and the sheath 14 (because of the spacing therebetween) adequate to preclude devitrification of the sheath 14, preferably at least 5 mils. Equivalent spacing may be provided between the top faces of the heater and sheath. A protrusion depth of about 30 mils is preferred.

Preferably, the protrusions 16 from opposite sides of the sheath 14 do not both contact the heater 12 when the heater is at room temperature. Sufficient clearance should be provided to enable the heater 12, (and especially the silicon carbide outer coating 26 thereof) to expand without damaging the sheath 14, the high purity quartz of the sheath 14 having a relatively low thermal coefficient expansion relative to silicon carbide. In general, however, the clearance between the protrusions 16 and the heater 12, and indeed the very depth of the protrusions 16, should be kept as low as possible to promote heat transfer from the heater 12 to the sheath 14, while still minimizing devitrification of the quartz of the sheath 14. Access means, such as a pipe 18, provide access to the interior of the sheath 14 by communicating with the annular space 30 between the heater 12 and sheath 14, and is equipped with means, such as a valve 20, for closing the access means 18. The sheath 14 and closure means 20 together define a substantially gas-impermeable enclosure totally containing the heater and precluding the loss of gas therefrom. Prior to use of the susceptor at elevated temperatures, it is essential that gases, such as air, in the annular space 30 be evacuated (for example, by means of the pipe 18 and valve 20); otherwise the elevated temperatures within annular space 30 could cause such gases to expand, with the possibility of a resultant breakage of the sheath 14, and even possibly an explosion. Preferably, after evacuation of the gases from the annular space 30, a gas of high thermal conductivity which is inert to both the quartz of the sheath 14 and the outer coating 26 of the heater 12 is introduced through the valve 20 and pipe 18 into the annular space 30. The amount of gas introduced is preferably such as to exert a pressure of about one atmosphere at the operating temperatures of the susceptor. Helium is a preferred gas in view of its high thermal conductivity (376.07 cal/sec-cm$^2$-°C.-cm $\times 10^{-6}$) and relative inertness to both silicon carbide and quartz. The pressure of helium introduced into the annular space 30 should be about 0.27 atmosphere at 0° C. so that at 1,000° C. the helium exerts a pressure of about 1 atmosphere. Naturally, the pressure of the helium or other gas introduced into the annular space 30 should be adjusted in order to provide the desired pressure at the anticipated operating temperature of the susceptor. In fine tuning this quantity, it should be kept in mind that the volume of the annular space 30 is not a constant, but will tend to diminish slightly with increasing temperature in view of the higher thermal coefficient of expansion of silicon carbide (the inner rings of annulus 30) relative to quartz (the outer ring of annulus 30). The use of helium rather than a vacuum in the annular space 30 enhances the heat transfer from the heater 12 to the sheath 14 through conduction.

Now that the preferred embodiments of the present invention have been shown and described, various modifications and improvements thereon will become readily apparent to those skilled in the art. Accordingly, the spirit and scope of the present invention is to be limited only by the appended claims, and not by the foregoing disclosure.

We claim:

1. A susceptor for use in a chemical vapor deposition in a radiant absorption heating system comprising:
   (A) a heater for absorbing radiant energy and redirecting heat therefrom; and
   (B) a sheath of high purity quartz completely surrounding said heater for supporting on its outer surface substrates to receive vapor deposition.

2. The susceptor of claim 1 further comprising means inside said sheath for spacing said sheath from said heater.

3. The susceptor of claim 2 wherein said spacing means is a part of said sheath and makes minimal contact with said heater.

4. The susceptor of claim 2 wherein said spacing means comprises protrusions from the interior surfaces of said sheath which terminate in tips of minimal area.

5. The susceptor of claim 1, 2, 3 or 4 further comprising means in said sheath for providing access to the interior of said sheath and means for closing said access means.

6. The susceptor of claim 5, wherein said sheath and said means for closing said access means together define a substantially gas-impermeable enclosure totally containing said heater.

7. The susceptor of claims 2, 3, or 4 wherein the space between said heater and said sheath is evacuated.

8. The susceptor of claims 2, 3, or 4 wherein a gas of relatively high thermal conductivity and relative inertness to the compositions of said sheath and heater is present in the space between said sheath and said heater.

9. The susceptor of claim 8 wherein said gas is helium.

10. The susceptor of claim 8 wherein the amount of gas is such as to exert a pressure of about one atmosphere at the operating temperature of said susceptor.

11. The susceptor of claims 1, 2, 3, or 4 wherein said heater has an interior of a first composition and a substantially pinhole-free outgas-inhibiting outer-coating.

12. The susceptor of claim 11 wherein said first composition is graphite.

13. The susceptor of claim 12 wherein said coating is composed of silicon carbide.

14. The susceptor of claim 11 wherein said coating is composed of silicon carbide.

15. The susceptor of claims 1, 2, 3, or 4 wherein the composition of the interior of said heater is selected from the group consisting of graphite, glassy carbon, quartz coated with black, molybdenum and silicon carbide.

16. The susceptor of claim 15 therein said interior heater composition is graphite.

17. The susceptor of claim 1 wherein said sheath is structurally self-supporting.

* * * * *